United States Patent [19]
Alderton

[11] Patent Number: 6,127,894
[45] Date of Patent: Oct. 3, 2000

[54] HIGH FREQUENCY SHUNT FEEDBACK AMPLIFIER TOPOLOGY

[75] Inventor: Martin Alderton, San Diego, Calif.

[73] Assignee: Uniden San Diego Research & Development Center, Inc., Fort Worth, Tex.

[21] Appl. No.: 09/010,094

[22] Filed: Jan. 21, 1998

[51] Int. Cl.[7] ...................................................... H03F 1/26
[52] U.S. Cl. ........................... 330/286; 330/294; 330/307
[58] Field of Search ..................................... 330/286, 294, 330/307; 333/161, 33, 32

[56] References Cited

U.S. PATENT DOCUMENTS 5,221,908  6/1993  Kotz et al. ............................... 330/307

Primary Examiner—Michael B Shingleton
Attorney, Agent, or Firm—Daniel R. Brown

[57] ABSTRACT

A shunt feedback circuit path for use in high frequency amplifiers fabricated as a transmission line coupled to ground at one end and coupled to the shunt feedback transmission line of the amplifier at the other end. The shunt feedback transmission line has a first and second resistive element and a first and second capacitive element. A quarter-wavelength transmission line is used to transform the impedance coupled to one end with respect to the other end. The impedance as seen from one end of the line is a function of the characteristic impedance of the line. Therefore, by selecting the characteristic impedance the transmission line can be used to affect the impedance of the feedback path so the transmission line appears as an inductor of reactance equal to the characteristic impedance of the quarter-wavelength transmission line and reduces the overall effective length of the feedback path.

17 Claims, 3 Drawing Sheets

HIGH FREQUENCY SHUNT FEEDBACK AMPLIFIER TOPOLOGY

BACKGROUND OF THE INVENTION

1. Field of the Invention

This invention relates to amplification of signals and, more particularly, to controlling amplifier gain in the amplification of high frequency signals.

2. Description of Related Art

Amplifiers are an important component in almost all electronic circuits. Amplifiers provide a means by which the amplitude of an input signal can be increased while maintaining the relative time-amplitude relationship of the input signal at each point in time. Amplifiers can be constructed to use feedback, which comprises taking a portion of the output signal and returning it to the amplifier input to form the signal that drives the amplifier. Generally, there are two types of feedback. One type of feedback is called positive feedback, and the other type of feedback is called negative feedback.

Positive feedback means that all or part of the amplifier output signal is added to the input of the amplifier to increase the input and thus increase the amount of gain the amplifier provides with respect to the gain that otherwise would be present in the absence of the positive feedback. Positive feedback is commonly considered to be undesirable, because positive feedback tends to destabilize an amplifier (i.e., tends to cause the amplifier output to oscillate). The exception to this general rule is amplifiers that are intentionally destabilized to generate an oscillating output signal at a desired frequency.

Amplifiers become unstable because very small amplitude inputs (such as random noise that typically occurs upon initial application of power to the amplifier) will be amplified at the output and will cause the input signal to increase. Because the input signal is then amplified by the amplifier, the amplitude at the output increases. The output is then fed back to the input, further increasing the input. It should be apparent that this cycle will continue until the amplifier is saturated and any change in the input will be of no effect at the output.

The second type of feedback mentioned above is called negative feedback. Negative feedback means that all or part of the output signal from the amplifier is subtracted at the input of the amplifier to reduce the input and thus lower the gain of the amplifier with respect to the gain that otherwise would be present in the absence of the negative feedback. Negative feedback may have a number of positive effects. First, negative feedback can stabilize an amplifier by reducing the gain of the amplifier and mitigating oscillation of the amplifier output. Stabilizing an amplifier means making the gain less dependent on the specific device parameters and reducing the chance that spurious oscillations in the amplifier will occur. Second, negative feedback can permit amplifiers to achieve more linear operation. Third, negative feedback can permit an amplifier to have a broader bandwidth of acceptable operation. Fourth, negative feedback can be used to lower the input and output impedance of the amplifier. Fifth, negative feedback can be used to reduce the noise in the amplifier output and reduce thermal effects.

Two particular types of negative feedback can be distinguished on the basis of the action of the feedback on the amplifier gain. These two types of feedback are called series feedback and shunt feedback. In general, a shunt feedback amplifier configuration is an amplifier with a feedback network connected across the amplifier input and output terminals. Shunt feedback amplifiers are widely used due to the many desirable properties associated with them. For example, shunt feedback amplifiers have well-controlled input and output impedances, improved stability, and improved amplitude slope and flatness.

One problem that occurs in the practical application of shunt feedback amplifiers is that at relatively high frequencies an excessive phase shift in the output signal can be introduced by the feedback path. More particularly, for negative feedback, it is desirable to provide a feedback signal with phase opposite that of the input signal, to limit the gain applied by the amplifier. If the length of the feedback path is too large for the frequencies involved, then the feedback path will introduce a phase shift that will cause undesirable, premature roll-off of the amplifier output. A feedback path of proper length will provide precisely optimally phased feedback that will increase the roll-off frequency.

It should be understood that the length of the feedback path is relative to the wavelength of the signals to be amplified. That is, the higher the frequencies at which the amplifier is required to operate, the shorter the feedback path must be. With some devices, a relatively long shunt feedback path may be necessary to physically couple the amplifier input to the amplifier output. The longer feedback paths can result in a reduction in the bandwidth over which the amplifier operates with a relatively flat frequency response. This is especially the case for high frequency (20–30 GHz) applications.

For example, a hybrid microwave integrated circuit (HMIC) is a circuit where an interconnect pattern and distributed circuit components are printed onto a substrate, and active and lumped circuit components are individually attached to the interconnect pattern with soldering and wire bonding techniques. The HMIC can have a hole cut through the substrate called a transistor cavity or chip hole, into which a single-chip transistor can be located and wire-bonded to the substrate. The length of a feedback path for the single-chip transistor will be limited by the dimensions of the chip hole and of the HMIC. For amplifier applications in the 20–30 GHz band, it is often impractical to provide a feedback path that is physically short enough to provide an optimally phased shunt feedback signal.

From the discussion above, it should be apparent that there is a need for a shunt feedback amplifier with improved performance in high frequency applications. The present invention fulfills this need.

SUMMARY OF THE INVENTION

The present invention provides a high frequency amplifier with a shunt feedback circuit having a transmission line that is coupled to ground at one end and is coupled to the shunt feedback path of the amplifier at the other end. The transmission line length is selected so that the feedback path acts as an impedance inverter and reduces the signal delay relative to the input signal, effectively shortening the length of the shunt feedback path. In this way, it is possible to provide a shunt feedback path that produces a feedback signal that is optimally phased with respect to the input for relatively high input frequencies. This increases the roll-off frequency and provides a relatively flat frequency response over an increased bandwidth, and in particular for high frequency applications.

An impedance inverter operates as a quarter-wavelength transmission line having a characteristic impedance K at all frequencies. Selecting an appropriate value for K, the impedance transforming effect of the inverter can be made negligible, and the phase shift can be precisely selected. In accordance with the invention, the transmission line is connected to the feedback path at one end and to ground at the other end. The transmission line thereby reduces the effective length of the feedback path without affecting the impedance seen by the amplifier.

In one aspect of the invention, the shunt feedback path includes a resistive element placed in series with the amplifier input and a capacitive element placed in series with the resistive element in the feedback path to provide a direct current (DC) block to prevent direct current to ground through the feedback path. In another aspect of the invention, each connecting leg of the shunt feedback path comprises a quarter-wavelength transmission line.

Other features and advantages of the present invention should be apparent from the following description of the preferred embodiment, which illustrates, by way of example, the principles of the invention.

DESCRIPTION OF THE PREFERRED EMBODIMENT

Figure 1:
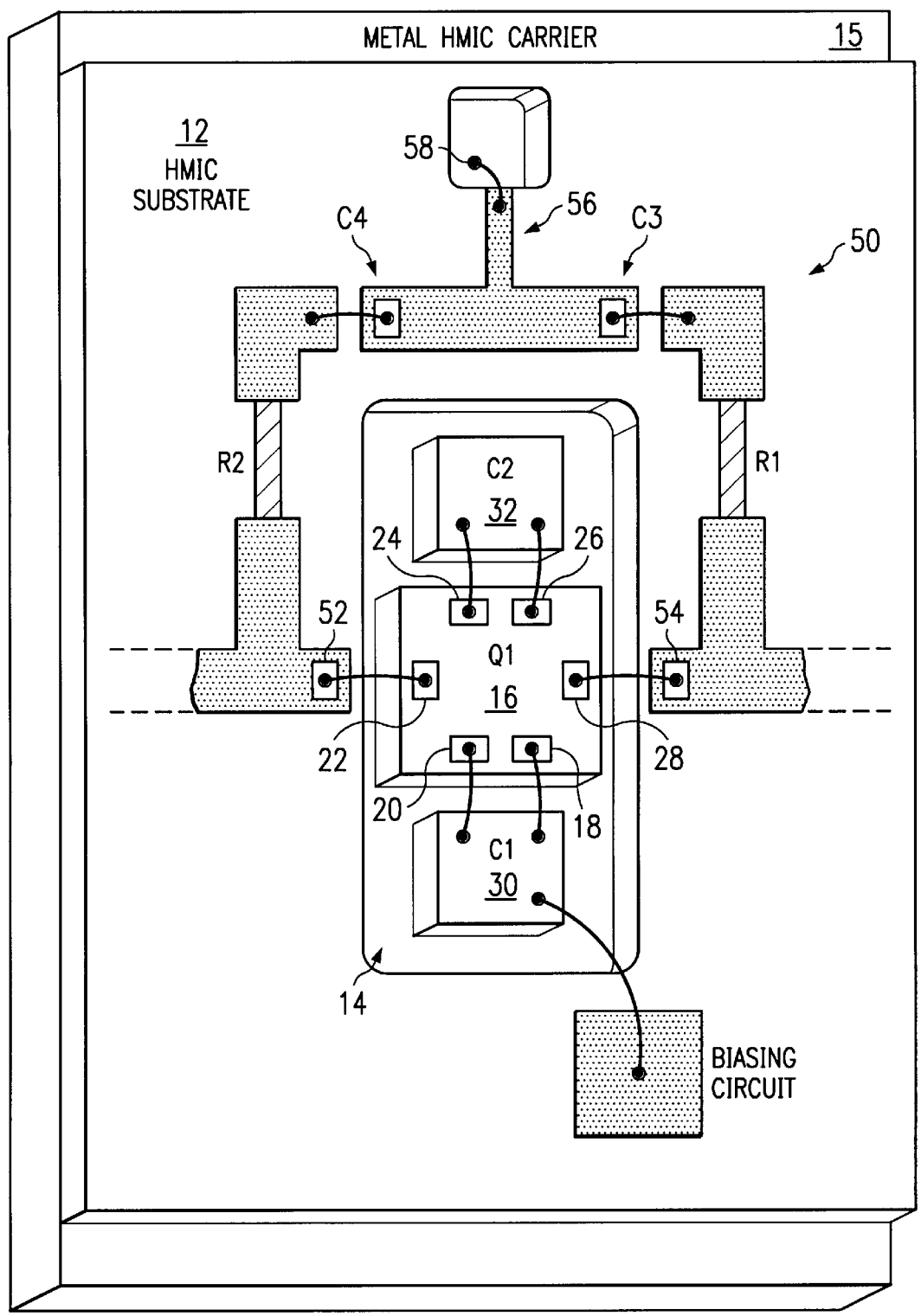
FIG. 1 is an illustration of a monolithic microwave circuit having a shunt feedback amplifier constructed in accordance with the present invention.

FIG. 1 is a representation of a hybrid microwave integrated circuit (HMIC) 10 constructed in accordance with the present invention. Relative dimensions are greatly exaggerated and not to scale, for purposes of illustration. The HMIC 10 includes a circuit substrate 12 into which is cut a chip cavity 14. The HMIC substrate is mounted on a metal HMIC carrier 15. A transistor amplifier chip Q1 16 includes numerous wire pads 18, 20, 22, 24, 26, 28 that are used to electrically connect the chip to the substrate 12. The transistor 16 is mounted on the HMIC carrier through the transistor cavity 14. In the illustrated embodiment, two optional capacitors 30, 32 labeled C1 and C2, respectively, are provided to bias the transistor 16. Conductive wires 34 extend from the capacitor 30 to wire pads 18, 20 and from the capacitor 32 to wire pads 24, 26 to electrically connect the capacitors to the transistor 16. One of the transistor wire pads 22 comprises an amplifier input terminal, and another of the transistor wire pads 28 comprises an amplifier output terminal. A shunt feedback path 50 extends on the HMIC substrate from an input connecting pad 52 to an output connecting pad 54. In accordance with the invention, the shunt feedback path includes a transmission line portion 56 coupled to ground 58 at one end and coupled to the shunt feedback path of the amplifier at the other end. In the preferred embodiment, the transmission line portion is constructed as an impedance inverter that reduces the signal delay at the output pad 54 relative to the input pad 52, and effectively shortens the length of the feedback path 50 to provide a transmission line feedback path that provides a relatively flat frequency response over an increased bandwidth.

In this way, the preferred embodiment of the present invention provides a shunt feedback amplifier having improved performance over a high frequency band (20–30 GHz) of interest. In particular, the amplifier topology provides improvements in performance by permitting a circuit designer to: (1) use a longer feedback path for the wavelengths of interest; (2) provide relatively flat response at higher frequencies than otherwise possible; (3) have greater flexibility and freedom in designing the amplifier layout; (4) more easily match the input and output impedance of the amplifier to load and input devices; and (5) stabilize the amplifier at low frequencies with fewer circuit components than would otherwise be required.

Figure 2:
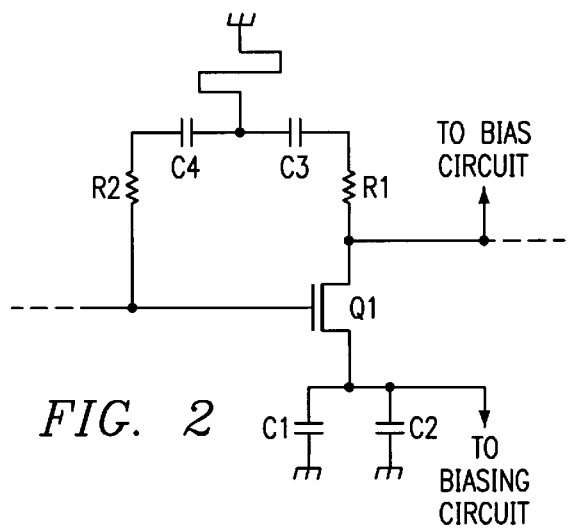
FIG. 2 is a circuit diagram showing the circuit of FIG. 1 in schematic form.
Figure 3:
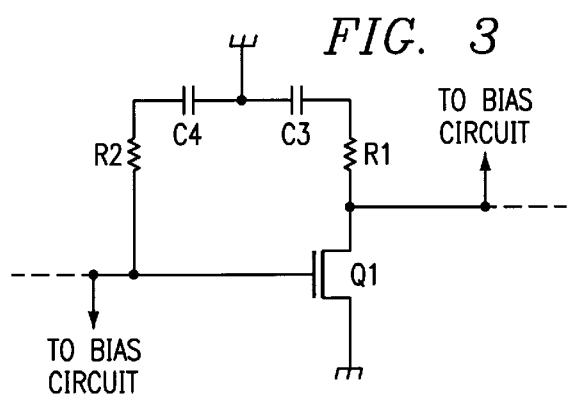
FIG. 3 is a circuit diagram showing an alternate embodiment of FIG. 1 without the bias capacitors.
Figure 4:
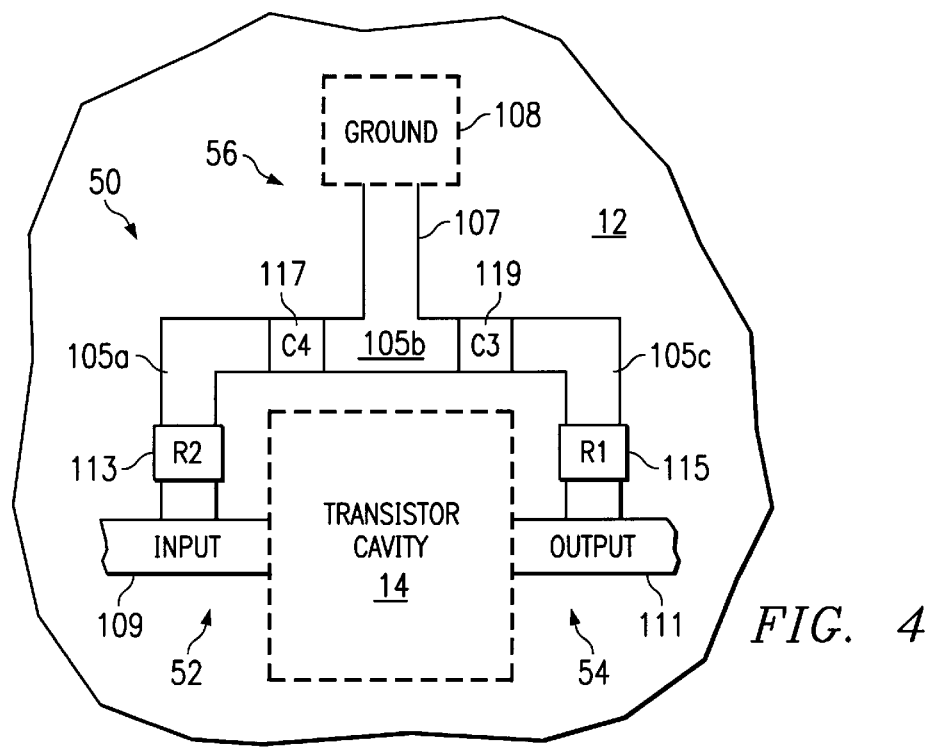
FIG. 4 depicts the topology of the shunt feedback amplifier illustrated in FIG. 1.

FIG. 2 is a circuit diagram of the FIG. 1 circuit showing the transistor Q1 connected with the biasing capacitors C1, C2 and the feedback path consisting of the loop including the resistors R1 and R2, and loop capacitors C3 and C4. As noted, the biasing capacitors are optional. FIG. 3 is a circuit diagram of the FIG. 1 circuit without the biasing capacitors.
Detailed Discussion of the Topology of the Present Invention FIG. 4 is an illustration of the amplifier topology for the amplifier circuit 10 illustrated in FIG. 1 showing the shunt feedback path 50 in greater detail, with the transistor amplifier 16 and other elements removed for clarity of illustration. As shown in FIG. 4, the feedback path 50 extends from the input terminal 52 to the output terminal 54 around the chip cavity 14 in which the amplifier is mounted. The substrate 12 is preferably a conventional sheet of dielectric material that is plated on two sides by a conductor, such as a metal, and is commonly used in the production of high frequency stripline circuits. The dielectric material is typically a sheet of polytetraflourethelyn (PTFE) and the conductive metal plating is typically a thin layer of copper applied on the top and bottom surfaces of the PTFE sheet.

In accordance with the preferred embodiment of the present invention shown in FIG. 4, the feedback path 50 is formed by an electrical conducting path on a first side of the substrate 12 that provides a "microstrip" feedback transmission line 105 electrically joining the input to the output and having a well-defined characteristic impedance. The characteristic impedance of the microstrip transmission line is a function of the width (w) of the electrical conducting path and the distance (h) between the electrical conducting path and a ground plane. The distance h is typically the thickness of the PTFE dielectric material that separates the two conductive copper layers that form the electrical conducting path transmission line on one side of the dielectric material, and the ground plane on the other side. Typically, a desired characteristic impedance is selected and the width of the transmission line is then determined by reference to a chart that cross-references the path width/height ratio (w/h) to the desired characteristic impedance for a particular dielectric constant of the PTFE material that separates the line from the ground plane.

In addition to the microstrip feedback transmission line, an impedance inverter segment 107 is formed in the feedback path 50. The impedance inverter segment 107 is coupled at one end to the microstrip feedback transmission line 105 and at the other end is coupled to the ground plane (represented in FIG. 2 by a dotted box 108). Two additional microstrip transmission lines are provided. The first of these is an input microstrip transmission line 109, which provides an electrical conduction path to the input port of a transistor amplifier 16 (FIG. 1) to be mounted in the transistor cavity. The second of these is an output microstrip transmission line 111, which provides an electrical conduction path to the output port of the transistor amplifier.

The feedback transmission line 105 is preferably coupled at one end to the input transmission line 109 by a first resistive component 113, and is preferably coupled at the other end to the output transmission line 111 by a second (optional) resistive component 115. A first and second capacitor 117, 119 are preferably placed in line with the feedback transmission line 105, thus breaking the feedback transmission line into three sections 105a, 105b, 105c. In accordance with one embodiment of the present invention, these capacitors 117, 119 are chip capacitors that are soldered in line with the feedback transmission line 105 on the substrate 12. Similarly, the resistive elements 113, 115 are preferably chip resistors that are soldered into place between the feedback transmission line 105 and the input transmission line 109 or output transmission line 111, respectively.

In the preferred embodiment, each of the three feedback line sections 105a, 105b, 105c comprises a quarter-wavelength transmission line. When the three sections are considered as a whole, the feedback path 105 acts as the desired impedance inverter to provide the appropriate signal delay.

Method for Fabricating the Present Invention

Figure 5:
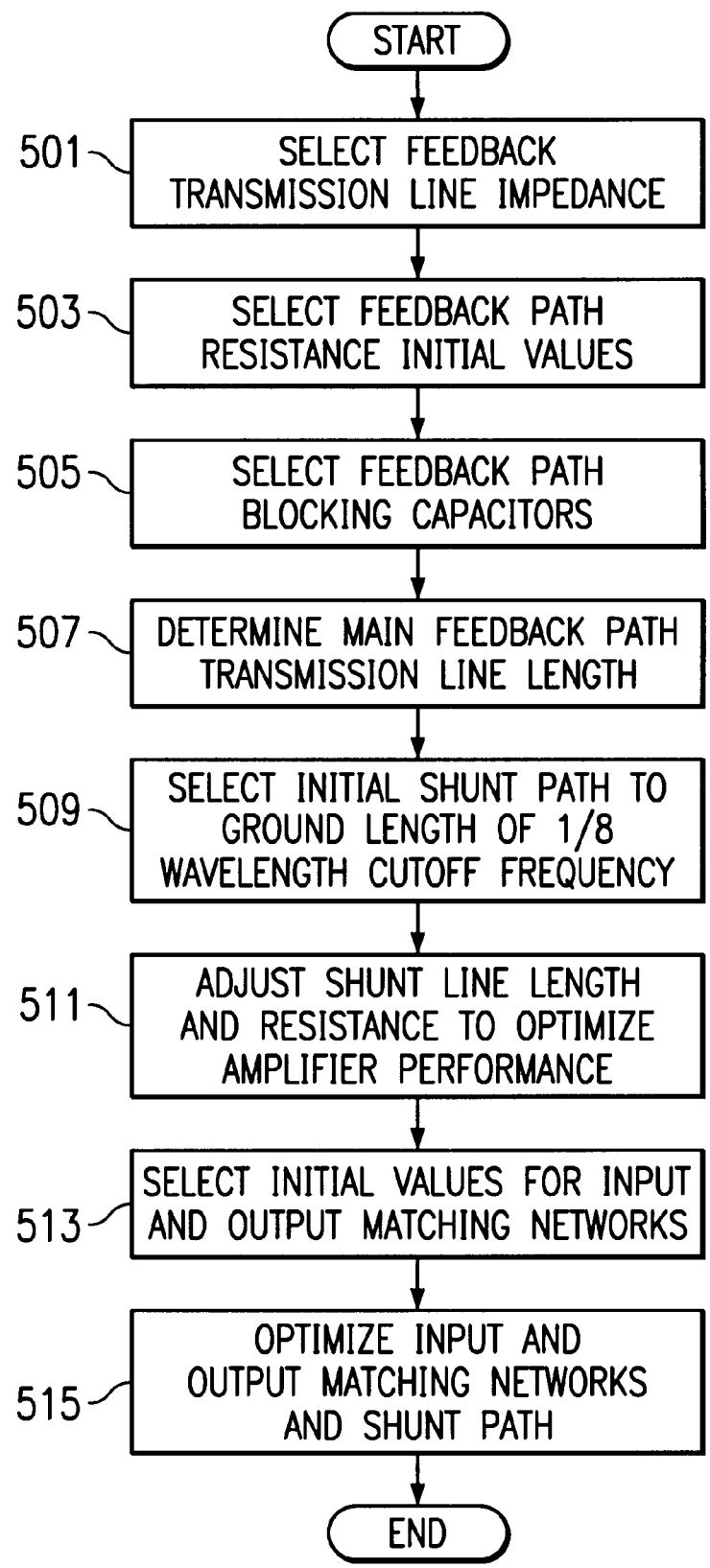
FIG. 5 is a flow diagram that illustrates the steps performed in constructing the shunt feedback amplifier illustrated in FIG. 4.

FIG. 5 is a flowchart that represents the steps performed for constructing a shunt feedback amplifier in accordance with the preferred embodiment of the present invention. As shown in FIG. 5, the first step of the process is to select the microstrip feedback transmission line 105 characteristic impedance (represented by the box labeled STEP 501). In accordance with one embodiment of the present invention suited to input frequencies in the band 20–30 GHz, the microstrip feedback transmission line 105 impedance will be between 50 and 200 ohms. The selection of the microstrip feedback transmission line 105 impedance is limited by the parameters of the substrate (such as the dielectric constant of the dielectric that separates the ground plane from the microstrip lines) and process parameters (e.g., the accuracy with which the lines can be formed, etc.).

Next, the resistances of the resistive elements 113, 115 are selected (the box labeled STEP 503). These values are preferably initially selected to be in the range of 100–500 ohms as a starting point. These values will be adjusted later in the process to determine the proper values more precisely for the particular physical properties of the circuits and frequencies of interest.

Once the resistance starting values have been selected, in STEP 503, the capacitance values of the capacitors 117, 119 are determined as represented by the box labeled STEP 305. The values of the capacitors 117, 119 are selected to minimize the in-band impedance. That is, since the purpose of the capacitors 117, 119 is to block only direct current (D.C.) that is used to bias the transistor, in the ideal, each capacitor 117, 119 would have no reactance (i.e., no impedance to frequencies above DC). However, in practice, the capacitors 117, 119 will always have some reactance to frequencies of interest. Therefore, the capacitors should be selected to minimize this reactance as much as is practicable for the particular amplifier circuit as a function of cost and the particular application for which the amplifier circuit is intended.

Next, the length of the microstrip feedback transmission line 105 is determined from the physical constraints of the circuit layout (STEP 507). Among the constraints considered are the size of the transistor cavity, the size of the transistor that is intended to be mounted in the cavity, the number of other components which might affect the layout, and the like. Those skilled in the art will understand how these factors can be taken into account in determining the length of the microstrip feedback transmission line microstrip feedback transmission line 105.

Next, an initial length for the transmission line 107 from the shunt feedback path 105b to ground is selected to be ⅛ of a whole wavelength at the amplifier cutoff frequency of interest (see STEP 509). The use of a transmission line 107 having a length of ⅛ the wavelength at the cutoff frequency is intended to provide a relatively wideband amplifier.

After the initial values are selected in the operations represented by the boxes labeled STEP 501–509, the length of the microstrip transmission line 107 and the resistance of the resistive elements 113, 115 are adjusted to optimize the flatness, bandwidth, and stability of the amplifier being used (see STEP 511). These adjustments are preferably made using a computer model of the amplifier and associated circuits, but can be made by modifying a physical circuit and measuring the performance of the amplifier. It will be understood by those skilled in the art that by adjusting the resistances of the resistive elements 113, 115, the circuit is provided with a well-defined input and output loads to out-of-band signals. This function can be accomplished by attaching loads as part of the matching networks, but then additional circuit area is consumed, which is typically undesirable.

Next, the initial impedance values of the input and output matching networks are selected (STEP 513). The input and output impedances are selected based upon conventional considerations. The input and output impedance and the length of the microstrip quarterwave transmission line 107 are then optimized for the best impedance match, frequency response, bandwidth, and stability.

Operation of the Present Invention

The present invention permits the use of a physically longer feedback path for frequencies of interest because the microstrip transmission line 107 acts as a phase shifter, thus reducing the net phase shift through the shunt feedback network. The net phase shift that occurs in the feedback path increases with higher frequency (i.e., as the wavelength of the signal being amplified decreases) due to the fact that the feedback path length is relatively greater with respect to the wavelength of the signal. Because the present invention permits the circuit designer to reduce the amount of phase shift that occurs between the input terminal and output terminal of the transistor amplifier, the maximum frequency at which the amplifier will operate is satisfactorily increased. Alternatively, the length of the feedback path can be increased.

To better understand why the shunt feedback path in accordance with the invention provides the described benefits, it should be noted that an idealized impedance inverter can be realized as an inductor of reactance $Z_o$ with transmission lines of length 45° less than zero on either side. Such an inverter operates as a one-quarter wavelength transmission line of characteristic impedance K at all frequencies. Therefore, if it is terminated in an impedance $Z_b$ on one end, the impedance seen by looking in at the other end is equal to:

$$Z_a = K^2/Z_b$$

where $Z_a$ is the impedance looking out at one end, $Z_b$ is the impedance looking out at the other end, and K is the characteristic impedance of the microstrip transmission line 107. If K is equal to $Z_o$, where $Z_b$ is the characteristic impedance of the microstrip feedback path 105, then the impedance transforming effect of the inverter will be transparent (i.e., it will provide a 1:1 transformation) and only the resultant phase shift due to the inverter need be considered. It can be seen that:

With $K = Z_o \tan|\phi/2|$;

$\phi = -\tan-1(2X/Z_o)$;

and $|X/Z_o| = \{K/Z_o\}/\{1-(K/Z_o)2\}$.

It should be noted that X>0 and $Z_o$>0, and therefore $\phi=-90°$ and $X=Z_o$

For K equal to $Z_o$, the impedance inverter is equivalent to an inductor of reactance $Z_o$ with transmission lines of length 45° less than zero on either side of the inductor. Accordingly, these transmission lines act to reduce the overall effective length of the feedback path. For K not equal to $Z_o$, there is some impedance transformation and some modification of the equivalent phase shift due to the inverter. Those skilled in the art will appreciate that these modifying factors can be manipulated as tuning elements.

If the impedance inverting inductor is realized as a transmission line connected to the microstrip transmission line 107 at one end and to ground at the other end, then the transmission line can be approximated at the frequency of interest as:

$L=(\zeta_o/2\pi f) \tan (2\pi l)$:

where $\zeta_o$=inductive line characteristic impedance f=frequency; and l=inductive line length, in wavelengths for line length l<0.25 wavelengths. From the description above, it should be understood that the placement of a less than quarter-wavelength transmission line at approximately the center of a shunt feedback transmission line of an amplifier will have the desired effect on the feedback path, as illustrated in FIG. 4.

Although the invention has been described with respect to a hybrid microwave integrated circuit (HMIC), it should be understood that other implementations are possible without departing from the teachings of the invention. For example, the shunt feedback path can be part of a monolithic microwave integrated circuit (MMIC), in which all interconnections and components, both active and passive, are fabricated simultaneously on a single semiconductor substrate, using plating, deposition, and etching processes. In that case, the feedback path 150 shown in FIG. 4 would represent elements integrally fabricated on the substrate as an MMIC, without discrete components. The MMIC construction eliminates discrete components and wire bond interconnections, and is especially common in the millimeter wave (30–300 G) region of the frequency spectrum.

Advantages of the Invention

The present invention provides a high frequency amplifier with a shunt feedback path having a transmission line that is coupled to ground at one end and is coupled to the shunt feedback path of the amplifier at the other end. With such a configuration, the feedback path acts as an impedance inverter and effectively shortens its length, thereby reducing signal delay through the path. The amplifier roll-off frequency is increased and has a relatively flat frequency response over an increased bandwidth, and in particular for high frequency applications in the 20–30 GHZ band.

The present invention has been described above in terms of a presently preferred embodiment so that an understanding of the present invention can be conveyed. There are, however, many configurations for high frequency amplifiers not specifically described herein but with which the present invention is applicable. The present invention should therefore not be seen as limited to the particular embodiment described herein, but rather, it should be understood that the present invention has wide applicability with respect to high frequency IC amplifiers generally. All modifications, variations, or equivalent arrangements and implementations that are within the scope of the attached claims should therefore be considered within the scope of the invention.

I claim:

1. A high frequency shunt feedback amplifier comprising:

a substrate having a ground plane;

a high frequency hybrid amplifier circuit located on the substrate, the amplifier circuit comprising an amplifier mounted in a transistor cavity of the substrate and having an input terminal and an output terminal; and a feedback path that electrically couples the amplifier input terminal and the amplifier output terminal, such that the feedback path includes (a) a first direct current blocking device, (b) a second direct current blocking device, (c) a first electrically resistive coupling element coupled between the amplifier input terminal and the first direct current blocking device, and (d) a transmission line circuit path electrically coupled between the first and second direct current blocking devices at a first end and electrically coupled to the ground plane at a second end, such that the second direct current blocking device is electrically coupled to the amplifier output terminal;

wherein the transmission line circuit path is selected such that it produces a feedback signal that is approximately ninety degrees out of phase with an amplifier input signal for high frequencies of interest.

2. A high frequency shunt feedback amplifier as defined in claim 1, further including a second electrically resistive device that is electrically coupled between the second direct current blocking device and the amplifier output terminal.

3. A high frequency shunt feedback amplifier as defined in claim 2, wherein the first and second electrically resistive elements are resistors.

4. A high frequency shunt feedback amplifier as defined in claim 1, wherein the amplifier operates with a cutoff frequency and the transmission line circuit path has a length no greater than approximately one quarter of the wavelength of the amplifier cutoff frequency.

5. A high frequency shunt feedback amplifier as defined in claim 1, wherein the first and second direct current blocking devices are capacitors.

6. A high frequency shunt feedback amplifier as defined in claim 1, wherein the first electrically resistive element is a resistor.

7. A high frequency shunt feedback amplifier as defined in claim 1, wherein the feedback path distance from the first direct current blocking device to the amplifier input terminal is approximately equal to the feedback path distance from the second direct current blocking device to the amplifier output terminal.

8. A high frequency shunt feedback amplifier as defined in claim 1, wherein the feedback path distance from the transmission line to the amplifier input terminal is approximately equal to the feedback path distance from the transmission line to the amplifier output terminal.

9. An amplifier comprising:
(a) a substrate having a ground plane;
(b) a high frequency transistor amplifier having at least a first port and a second port, the transistor being mounted on the substrate;
(c) a first and second direct current blocking device having two terminals;
(d) a first electrically resistive device having a first and second terminal, the first terminal of the resistive device being coupled to the first port of the transistor;
(e) a second electrically resistive device having a first and second terminal, the first terminal of the second electrically resistive device being coupled to the second port of the transistor;
(f) a first transmission line, coupled to the second terminal of the second electrically resistive device at a first end and to the first terminal of the first direct current blocking device at the second end of the first transmission line;
(g) a second transmission line, coupled to the second terminal of the first direct current blocking device at a first end and to the first terminal of the second direct current blocking device at the second end;
(h) a third transmission line, coupled at a first end to the second terminal of the second direct current blocking device and at a second end, to the second terminal of the first electrically resistive device; and
(i) a fourth transmission line, coupled at a first end to the second transmission line at a point along the second transmission line and coupled at a second end to the ground plane.

10. An amplifier as defined in claim 9, wherein the amplifier has a cutoff frequency and the fourth transmission line is no greater in length than approximately one quarter of the wavelength of the cutoff frequency of the amplifier.

11. An amplifier as defined in claim 9, wherein the first, second, third, and fourth transmission lines are microstrip lines.

12. An amplifier as defined in claim 9, wherein the first and second direct current blocking devices are capacitors.

13. An amplifier as defined in claim 9, wherein the first and second electrically resistive elements are resistors.

14. An amplifier as defined in claim 9, wherein the substrate further includes a cavity and the transistor is mounted within the cavity.

15. An amplifier as defined in claim 9, wherein the fourth transmission line is coupled to the second transmission line approximately at a point equally distant from the first and second electrically resistive element.

16. An amplifier as defined in claim 9, wherein the amplifier comprises packaged transistor mounted on the substrate.

17. An amplifier as defined in claim 9, wherein the amplifier is integrally fabricated with the substrate as a monolithic microwave integrated circuit.

* * * * *